(12) United States Patent
Chang et al.

(10) Patent No.: US 11,888,394 B2
(45) Date of Patent: Jan. 30, 2024

(54) HIGH-EFFICIENCY PULSE WIDTH MODULATION FOR SWITCHING POWER CONVERTERS

(71) Applicant: DIALOG SEMICONDUCTOR (UK) LIMITED, London (GB)

(72) Inventors: Kevin Yi Cheng Chang, Chandler, AZ (US); Kelly Consoer, Chandler, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 28 days.

(21) Appl. No.: 17/462,985

(22) Filed: Aug. 31, 2021

(65) Prior Publication Data

US 2021/0399636 A1 Dec. 23, 2021

Related U.S. Application Data

(62) Division of application No. 16/450,829, filed on Jun. 24, 2019, now Pat. No. 11,108,321.

(51) Int. Cl.
*H02M 3/156* (2006.01)
*H03K 5/24* (2006.01)
(Continued)

(52) U.S. Cl.
CPC .............. *H02M 3/156* (2013.01); *H02M 1/08* (2013.01); *H03K 5/24* (2013.01); *H02M 1/0048* (2021.05)

(58) Field of Classification Search
CPC .......... H02M 3/02; H02M 3/04; H02M 3/135; H02M 3/137; H02M 3/139; H02M 3/142; H02M 3/145; H02M 3/155; H02M 3/1552; H02M 3/156; H02M 3/1566; H02M 3/157; H02M 3/158; H02M 3/1588; H02M 1/0003; H02M 1/0012; H02M 1/0016; H02M 1/0019; H02M 1/0025; H02M 1/0041; H02M 1/0048; H02M 1/08; H02M 1/082; H02M 1/14; H03K 5/22; H03K 5/24–249; Y02B 70/10
(Continued)

(56) References Cited

U.S. PATENT DOCUMENTS 6,025,706 A * 2/2000 Takimoto .............. H02M 3/156
 323/282
6,252,430 B1 6/2001 van der Wagt et al.
(Continued)

FOREIGN PATENT DOCUMENTS

DE 102009024159 A1 12/2010

OTHER PUBLICATIONS

Behzad Razavi; "The StrongARM Latch"; IEEE Solid-State Circuits Magazine, Spring 2015, pp. 12-17.
(Continued)

*Primary Examiner* — Thienvu V Tran
*Assistant Examiner* — Carlos O Rivera-Perez
(74) *Attorney, Agent, or Firm* — Haynes and Boone, LLP

(57) ABSTRACT

A switching power converter is provided with a one-shot bias boosting circuit that responds to a premature trip point to boost the performance of a linear comparator in a pulse width modulator. In a sense-amplifier based implementation of the comparator, a clock-edge generator boosts the performance of the sense amplifier at the premature trip point.

8 Claims, 9 Drawing Sheets

(51) Int. Cl.
*H02M 1/08* (2006.01)
*H02M 1/00* (2006.01)

(58) Field of Classification Search
USPC ........ 323/222–226, 234, 266, 271–275, 280,
323/282–286, 351; 363/123, 124
See application file for complete search history.

(56) References Cited

U.S. PATENT DOCUMENTS

| | | | |
|---|---|---|---|
| 6,580,253 | B2 | 6/2003 | Kanakubo et al. |
| 7,443,147 | B2 * | 10/2008 | Kasai ................. H02M 3/1582 |
| | | | 332/110 |
| 9,030,184 | B2 | 5/2015 | Huang et al. |
| 9,806,617 | B1 * | 10/2017 | Ozawa ................ H02M 3/1588 |
| 2003/0231012 | A1 | 12/2003 | Corva et al. |
| 2005/0017761 | A1 | 1/2005 | Akita et al. |
| 2008/0036443 | A1 | 2/2008 | Kojima |
| 2012/0091981 | A1 | 4/2012 | Komiya |
| 2018/0226875 | A1 * | 8/2018 | Curtis .................... H02M 1/36 |
| 2020/0106357 | A1 | 4/2020 | Wiersch et al. |

OTHER PUBLICATIONS

Bernhard Wicht; "Yield and Speed Optimization of a Latch-Type voltage Sense Amplifier"; IEEE Journal of Solid-State Circuits, vol. 39, No. 7, Jul. 2004, pp. 1148-1158.
Paul M. Furth; "On the Design of Low Power CMOS Comparators with Programmable Hysteresis"; 2010 53rd IEEE International Midwest Symposium on Circuits and Systems (MWSCAS); pp. 1077-1080.

* cited by examiner

HIGH-EFFICIENCY PULSE WIDTH MODULATION FOR SWITCHING POWER CONVERTERS

CROSS-REFERENCE TO RELATED APPLICATION

This application is a Divisional of U.S. patent application Ser. No. 16/450,829, filed on Jun. 24, 2019 and entitled "HIGH-EFFICIENCY PULSE WIDTH MODULATION FOR SWITCHING POWER CONVERTERS," issuing on Aug. 31, 2021 as U.S. Pat. No. 11,108,321, the benefit of which is claimed and the disclosure of which is incorporated herein by reference in its entirety.

TECHNICAL FIELD

This application relates to switching power converters, and more particularly to a high-efficiency pulse width modulation for switching power converters.

BACKGROUND

The feedback loop in a switching power converter generates a control signal based upon the difference between the output voltage and the desired output voltage. If the control signal indicates that the output voltage is too high, the output power is reduced. Conversely, if the control signal indicates that the output voltage is too low, the output power is increased. This regulation of the output power responsive to the control signal may be performed using a number of different modulation schemes. For example, during periods of high power demand, it is conventional to pulse width modulate the power switch cycling responsive to the control signal. To modulate the pulse width, a comparator compares the control signal to a ramp signal. Depending upon the level of the control signal, the comparator output signal will pulse high for a corresponding pulse width during each cycle of the ramp signal.

The comparator needs to be relatively high speed because its delay contributes to the overall propagation delay through the feedback loop. As this delay increases, the phase margin deteriorates for the feedback loop. For example, at a switching rate of 100 MHz, the total delay from the pulse width modulator to the switching node (the output of the power switch transistor) should be less than 5 ns for robust control in a buck converter feedback loop. To provide increased comparator speed, it is conventional to use a clocked comparator that is clocked synchronously with the master clock signal controlling the switching rate of the power switch. But a clocked comparator approach is incompatible with systems in which the comparator must perform asynchronously. A linear comparator is asynchronous, but power consumption is increased at higher operating speeds.

Accordingly, there is a need in the art for switching power converter pulse width modulators with increased operating speed that also have reduced power consumption.

SUMMARY

A switching power converter is provided with a boosted pulse width modulator that asserts a comparator output signal when a ramp signal equals an error signal at a trip point. There are two main embodiments depending upon whether a comparator in the boosted pulse width modulator is a linear comparator or is a clocked comparator. In a linear comparator embodiment, either the ramp signal or the error signal is level shifted to form a level-shifted signal. The remaining one of the ramp signal or the error signal is not level-shifted. A one-shot circuit pulses a boosting signal at a premature trip point when the level-shifted signal equals the non-level shifted signal. A bias current for the linear comparator is boosted while the boosted signal is pulsed to enhance operation speed. In a clocked comparator embodiment, the one-shot circuit is replaced by a clock edge generator that generates a triggering edge (either rising or falling) in an enable signal for the clocked comparator.

These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

An improved switching power converter pulse width modulator is provided that anticipates the trip point for the comparison of the control signal to the ramp signal to determine the pulse width for the current switching cycle. To anticipate the trip point at which the control signal equals the ramp signal, the pulse width modulation uses an additional threshold that may be denoted as a "premature" trip point. This additional threshold is slightly displaced from the control signal so that the ramp signal will equal the additional threshold before it reaches the trip point. The response to the crossing of the premature trip point depends upon whether the pulse width modulator includes a linear comparator or a clocked comparator. In embodiments with a linear comparator, the crossing of the premature trip point triggers a one-shot bias boosting circuit to assert a relatively-short one-shot pulse. During the assertion of the one-shot pulse, the bias current to the linear comparator is increased so that the boosted linear comparator may respond more quickly to the trip point for the comparison of the control signal to the ramp signal. In embodiments with a clocked comparator such as a sense-amplifier-based comparator, the pulse width modulator includes a clock-edge generator that generates an enable signal having a triggering clock edge (which may be a rising edge or a falling edge depending upon the clocked comparator embodiment) that enables the clocked sense amplifier. The linear comparator embodiments with will be discussed first followed by a discussion of the clocked comparator embodiments.

Figure 1:
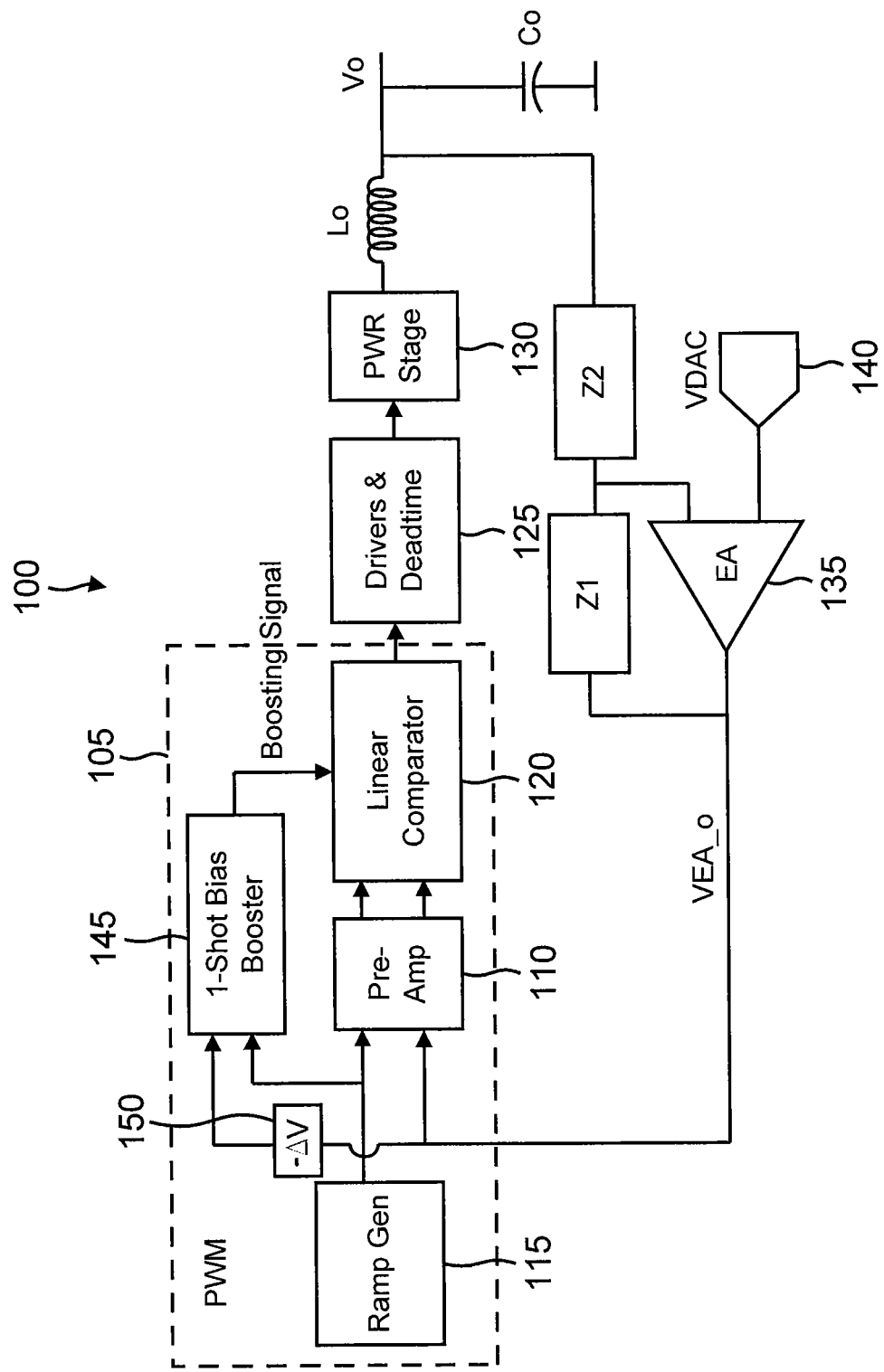
FIG. 1 illustrates a DC-DC switching power converter with a boosted pulse width modulator in accordance with an aspect of the disclosure.

An example DC/DC switching power converter 100 with a boosted pulse width modulator 105 is shown in FIG. 1. Boosted pulse width modulator 105 includes a pre-amplifier 110 that amplifies and buffers an error signal (VEA_o) and also a ramp signal from a ramp generator 115. At the trip point when the amplified error signal equals the amplified ramp signal, a linear comparator 120 asserts its output signal to trigger a power switch driver and deadtime controller 125 to control the switching of a power stage 130. For example, power stage 130 may include a high-side power switch and a low-side power switch as known in the buck converter arts. The pulse width of the cycling of high-side power switch is determined by the pulse width of the linear comparator output signal assertion. The resulting cycling of power stage 130 energizes an inductor Lo so that an output voltage is produced across an output capacitor Co.

The output voltage is compared by an error amplifier 135 to a reference voltage such as provided by a digital-to-analog converter (DAC) 140 to generate the error signal voltage VEA_o. Impedances Z1 and Z2 compensate error amplifier 135. To provide the boosting of linear comparator 120 just prior to the trip point, pulse width modulator 105 includes a one-shot bias boosting circuit 145 that pulses a boosting signal (Bias_Boosting). Linear comparator 120 is configured to increase its bias current while the boosting signal is asserted. Since the bias current is increased shortly before the trip point, the operating speed of linear comparator 120 is advantageously enhanced. Yet power consumption is not significantly increased because the one-shot pulse width for the pulsed boosting signal is relatively short compared to the ramp signal period. To generate the premature trip point for the linear comparator boosting, a level shifter 150 level shifts down the error signal to form a level-shifted error signal. One-shot bias boosting circuit 145 is configured to assert the boosting signal at the premature trip point when the ramp signal equals the level-shifted error signal. Alternatively, the ramp signal may be level-shifted up and compared to the error signal to generate the boosting signal.

Figure 2:
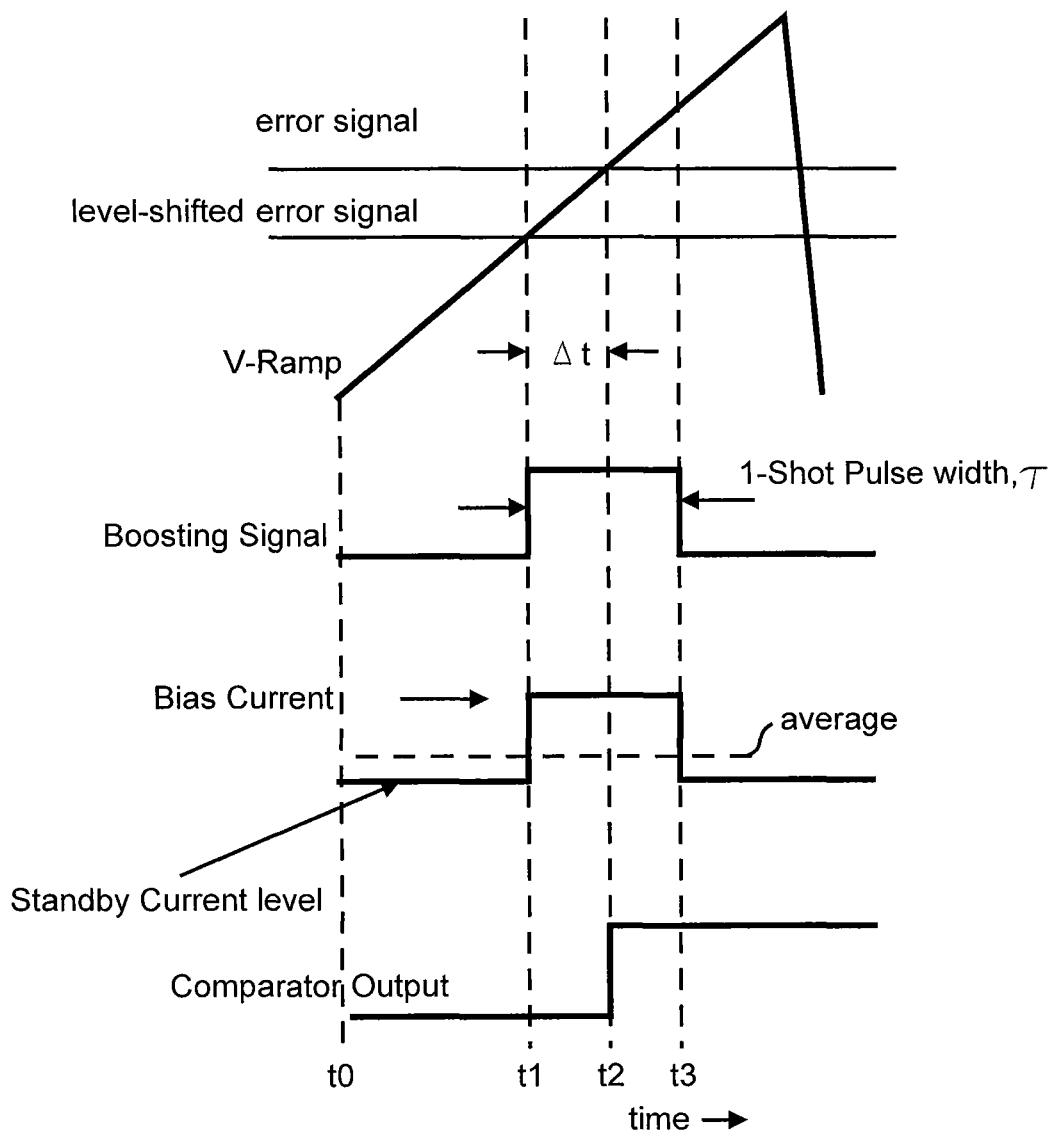
FIG. 2 is plot of various waveforms for the boosted pulse width modulator of FIG. 1.

Operation of pulse width modulator 105 may be better appreciated through a consideration of the waveforms shown in FIG. 2. A ramp signal begins its cycle at a time to. The ramp signal continues to rise until it reaches the premature trip point when it equals the level-shifted error signal at a time t1. Since the level-shifted error signal is level-shifted down with respect to the error signal, the premature trip point occurs before the trip point at a time when the error signal equals the ramp signal. The boosting signal is asserted at time t1 so that the bias current is increased from a standby level to a boosted level at time t1. Since the bias current is boosted, the comparator output signal may be quickly asserted at the trip point at time t2. The ramp signal then continues to rise until it reaches its maximum level. Prior to the ramp signal reaching its limit, the boost signal is reset at time t3. The pulse width of the boosting signal is thus relatively short compared to the ramp signal. The average bias current is thus not significantly higher than the standby bias current.

Figure 3A:
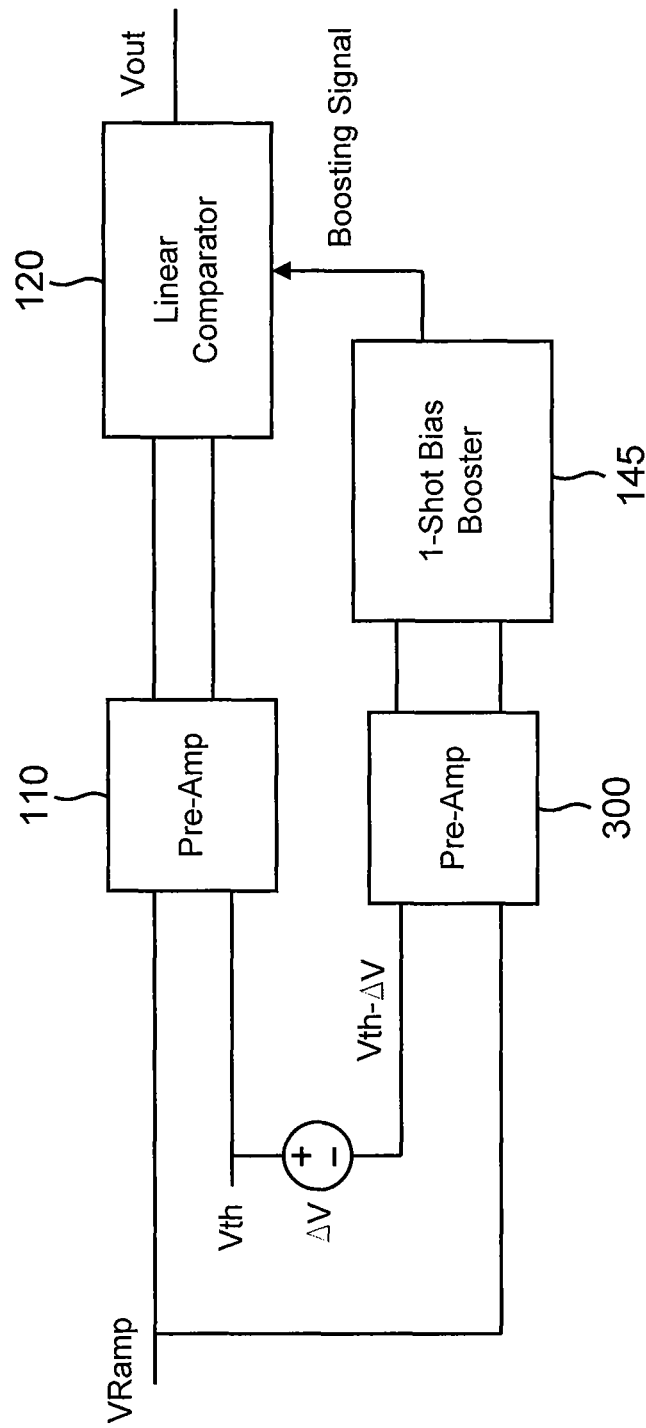
FIG. 3A illustrates a portion of an alternative embodiment for a pulse width modulator that includes a pre-amplifier for preventing feedthrough in the one-shot circuit for the generation of the boosting signal.
Figure 3B:
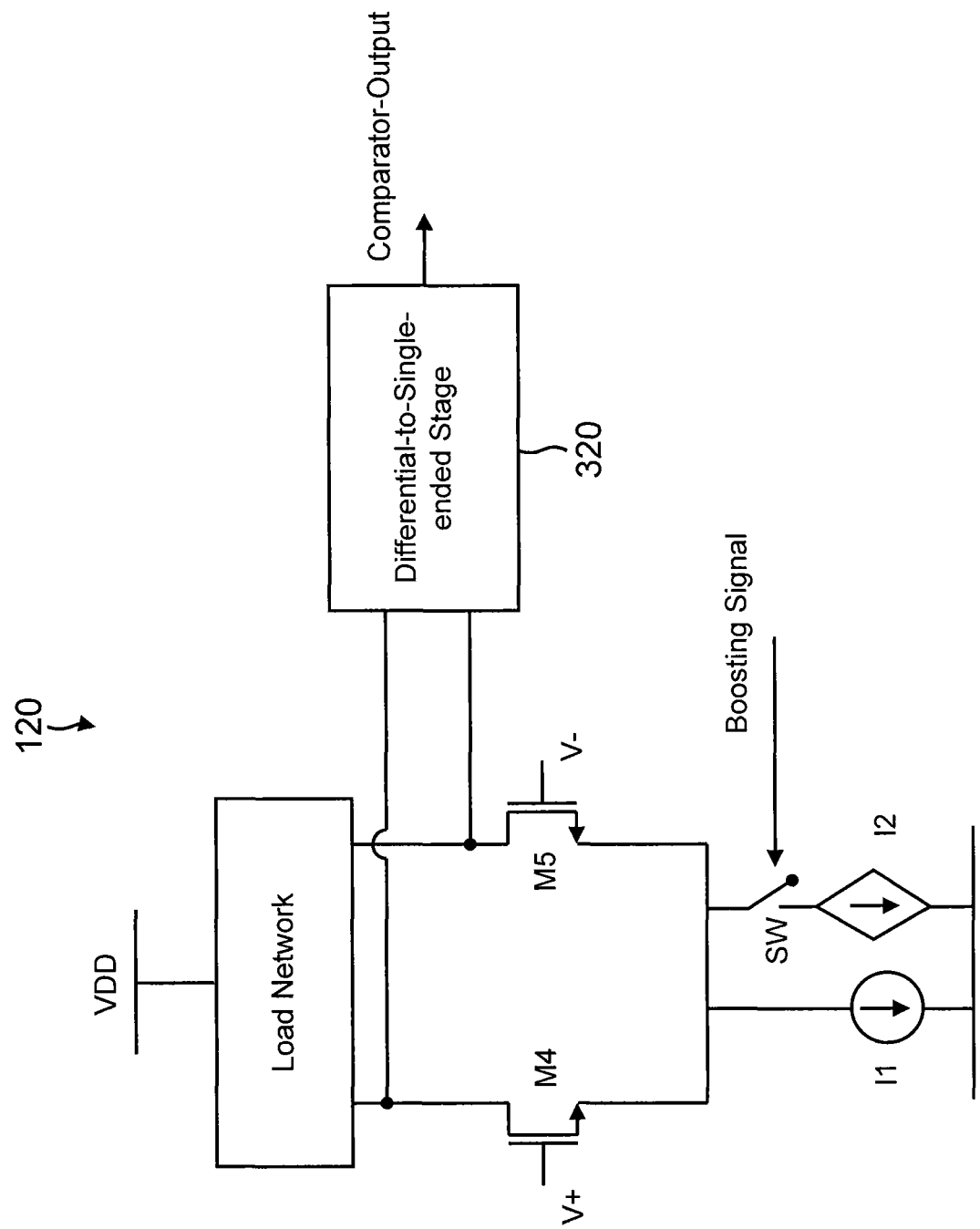
FIG. 3B illustrates the linear comparator of FIG. 3A in more detail.

To provide additional protection against feedthrough, a pre-amp 300 may be used to amplify and buffer the level-shifted error signal and the ramp signal that are compared by one-shot circuit 145 to generate the premature trip point as shown in FIG. 3A. An embodiment for linear comparator 120 is shown in more detail in FIG. 3B. A differential pair of NMOS transistors M4 and M5 respond to the level-shifted error signal (V+) and the ramp signal (V−) to steer a tail current (the bias current). Outside of the boost period, the tail current is set to a relatively low level by current source I1. The boosting signal controls a switch SW to couple an additional current source 12 so as to boost the bias current. The drains of transistors M4 and M5 couple to the power supply node through a load network to form a differential output signal that is converted into the single-ended comparator output signal by a differential-to-single-ended stage 320.

Figure 4:
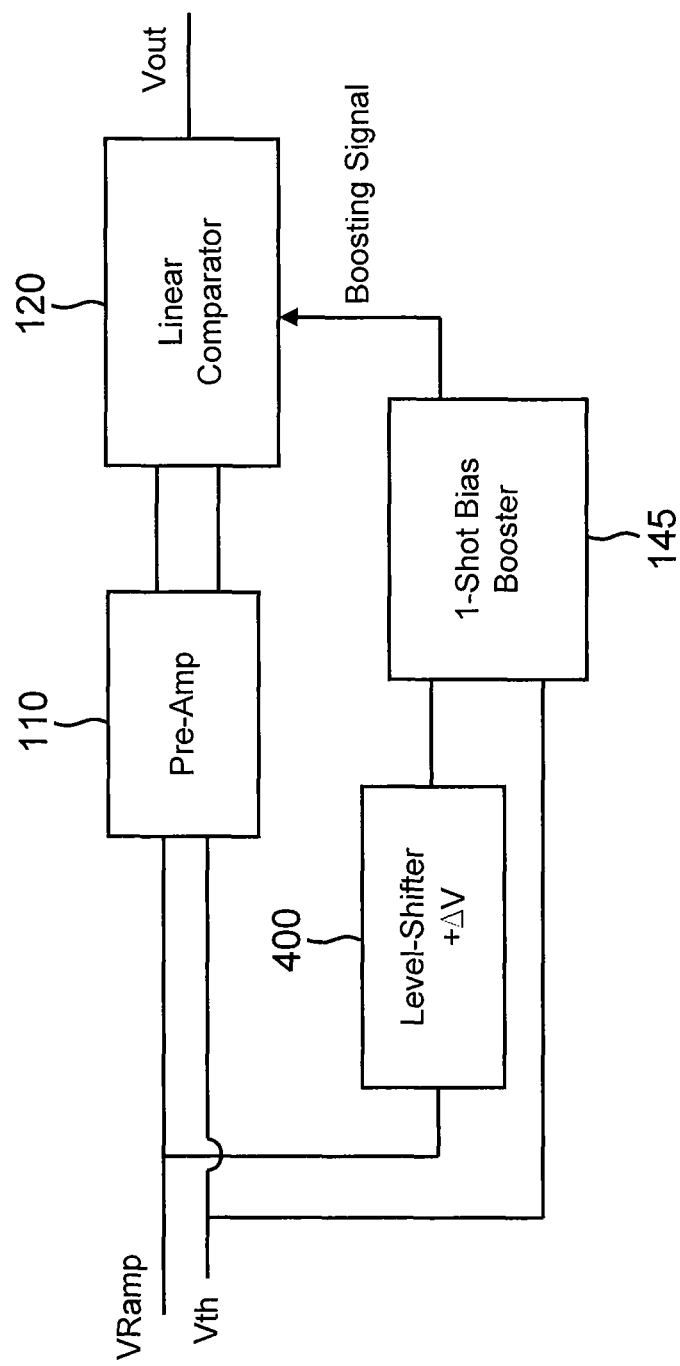
FIG. 4 illustrates a portion of an alternative embodiment for a pulse width modulator in which the ramp signal is level-shifted.
Figure 5:
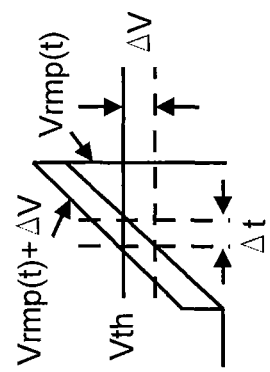
FIG. 5 is a graph of the ramp signal, the level-shifted ramp signal, and the error signal for the pulse width modulator of FIG. 4.

As noted earlier, the ramp signal may be level-shifted instead of level-shifting the error signal. An example level-shifter 400 shown in FIG. 4 increases the ramp signal by a voltage difference $\Delta V$ to form a level-shifted ramp signal that is compared to the error signal by one-shot bias booster circuit 145. As shown by the waveforms in FIG. 5, the level-shifted ramp signal (Vrmp(t)+$\Delta V$) equals the error signal (Vth) at a premature trip point that occurs a time difference $\Delta t$ prior to the trip point. The level-shifting of the ramp signal may be readily performed using a resistive voltage divider.

Figure 6:
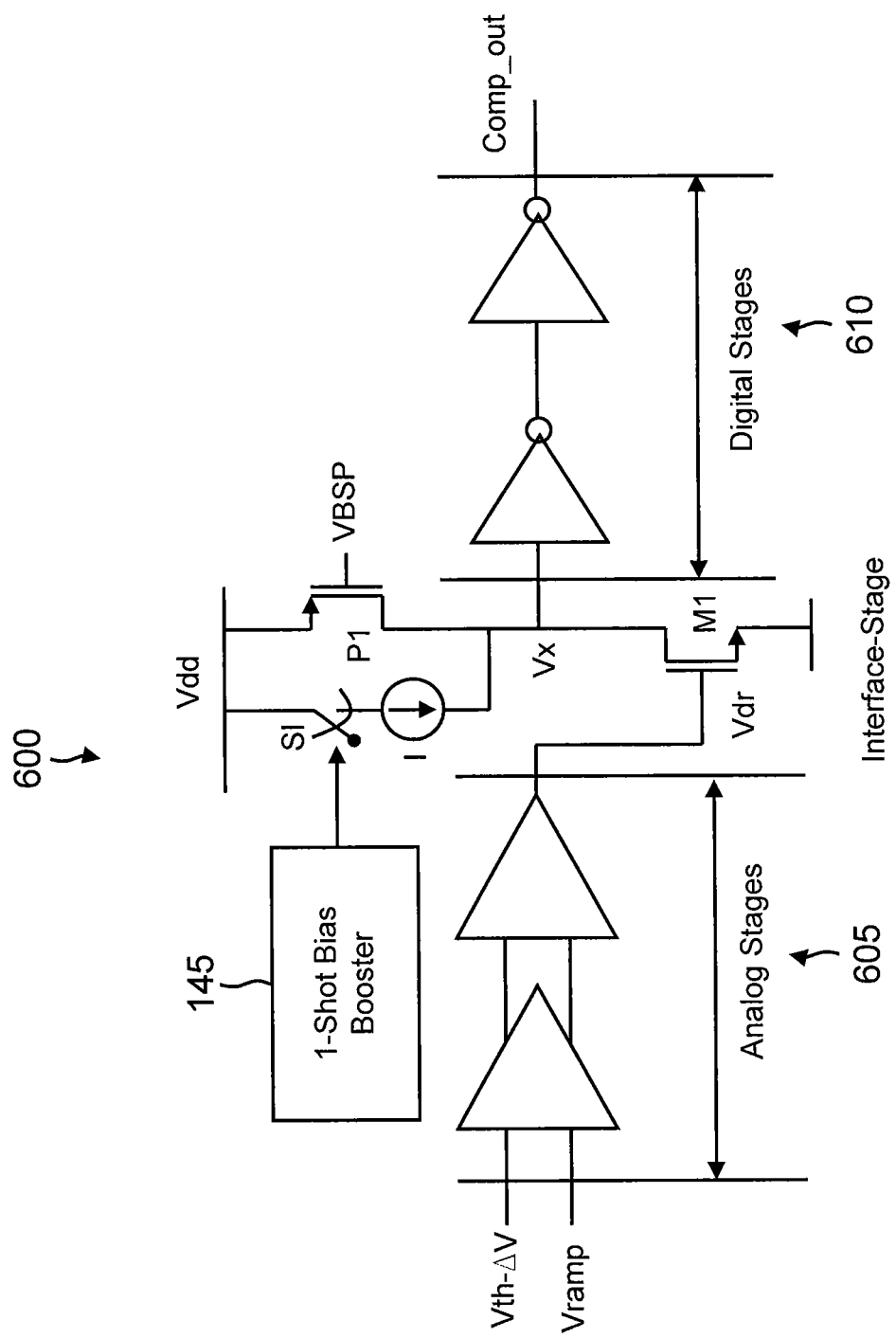
FIG. 6 illustrates a linear comparator embodiment in which the bias current boosted by the one-shot circuit is used to bias a voltage node.

Rather than boost the bias current for the linear comparator, a linear comparator 600 may be configured to adjust the bias of a threshold voltage node between a set of analog gain stages 605 and a set of digital buffer stages 610 as shown in FIG. 6. The analog gain stages 605 drive a gate of a transistor M1 responsive to the comparison between the level-shifted signal and the non-level shifted signal. In linear comparator 600, it is the error signal that is the level-shifted signal as compared to the ramp signal. A drain terminal for an NMOS transistor M1 forms a bias node that couples to a power supply voltage rail through a PMOS transistor P1 controlled by a bias signal VBSP. Transistor P1 may be relatively weak compared to transistor M1 such that a bias voltage Vx for the bias node is substantially grounded prior to the premature trip point. At the premature trip point, one-shot bias boosting circuit 145 switches on a switch Si so that a current source I also biases the bias node. The bias voltage Vx thus rises to a voltage slightly lower than the trip point for digital stages 610. Digital stages 610 can thus react quickly when transistor M1 is switched at the premature trip point so that digital stages 610 assert the comparator output signal (Comp_out).

Figure 7A:
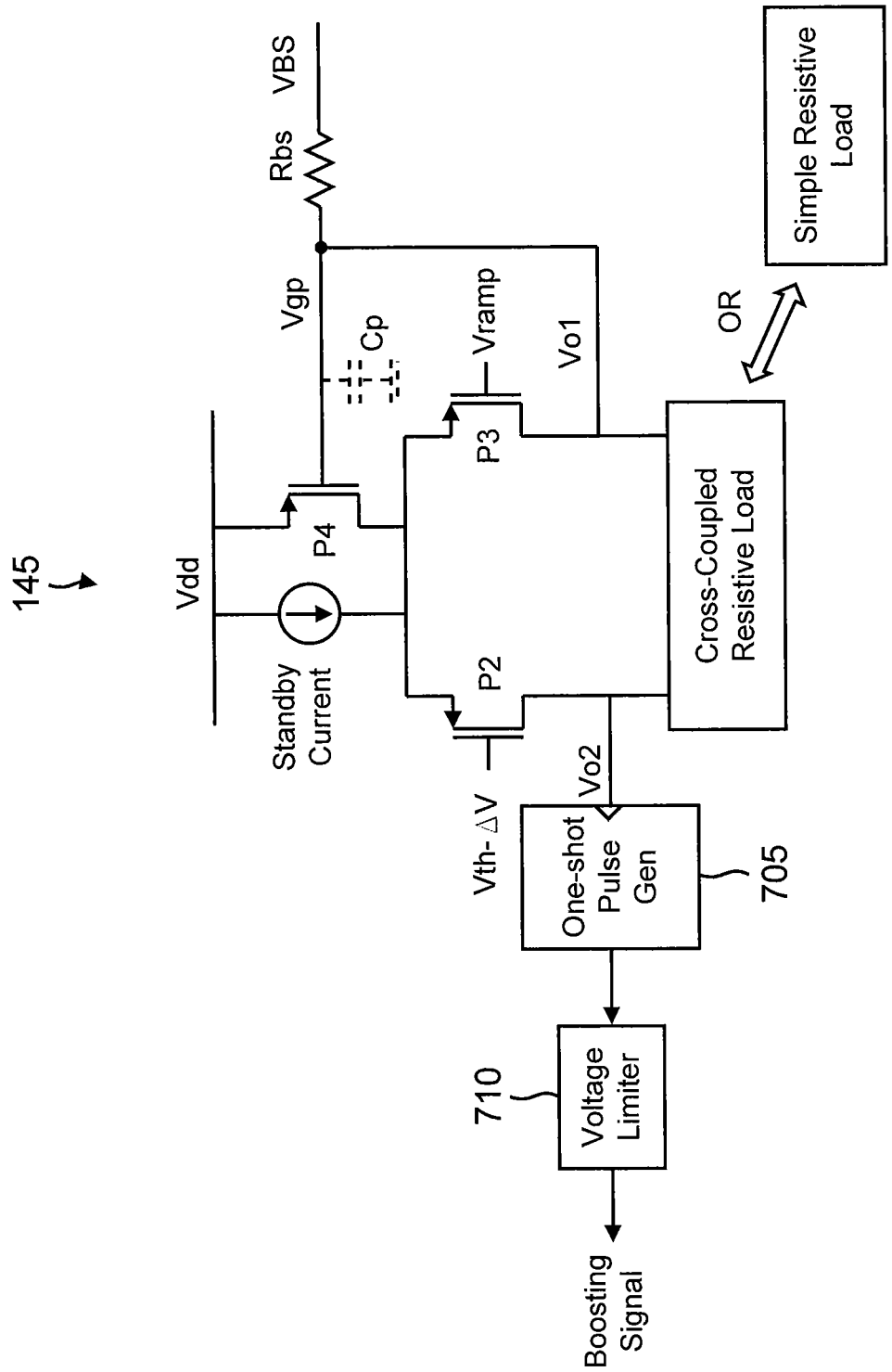
FIG. 7A is a circuit diagram of an example one-shot boosting circuit.

One-shot bias boosting circuit 145 may be constructed as shown in FIG. 7A. A comparator stage includes a differential pair of PMOS transistors P2 and P3. The level-shifted error signal drives the gate of transistor P2 whereas the ramp signal drives the gate of transistor P3. Prior to the premature trip point, transistor P2 will be off such that its drain voltage Vo2 is grounded through a cross-coupled resistive load (which may also be a simple resistive load in alternative embodiments). At the premature trip point, transistor P3 switches off so its drain voltage Vo1 is discharged. The discharge of drain voltage Vo1 discharges a gate voltage Vgp for a PMOS transistor P4 to cause transistor P4 to switch on. Prior to the premature trip point, only a standby current biased the differential pair of transistors. But the switching on of transistor P4 at the premature trip point causes transistor P4 to turn on to substantially increase the bias current. The gate voltage Vgp is biased by a bias voltage VBS through a resistor Rbs. The resistor Rbs and the parasitic capacitance for transistor P4 form an RC time constant. The bias voltage thus takes several multiples of the time constant to charge the gate voltage Vgp back to its steady-state value. Prior to the recovery of the drain voltage Vo1 to its steady-state value, the charging of the drain voltage Vo2 for transistor P2 causes a one-shot pulse generator 705 to pulse the boosting signal. This pulsing may be voltage limited by a voltage limiter 710 if necessary.

Figure 7B:
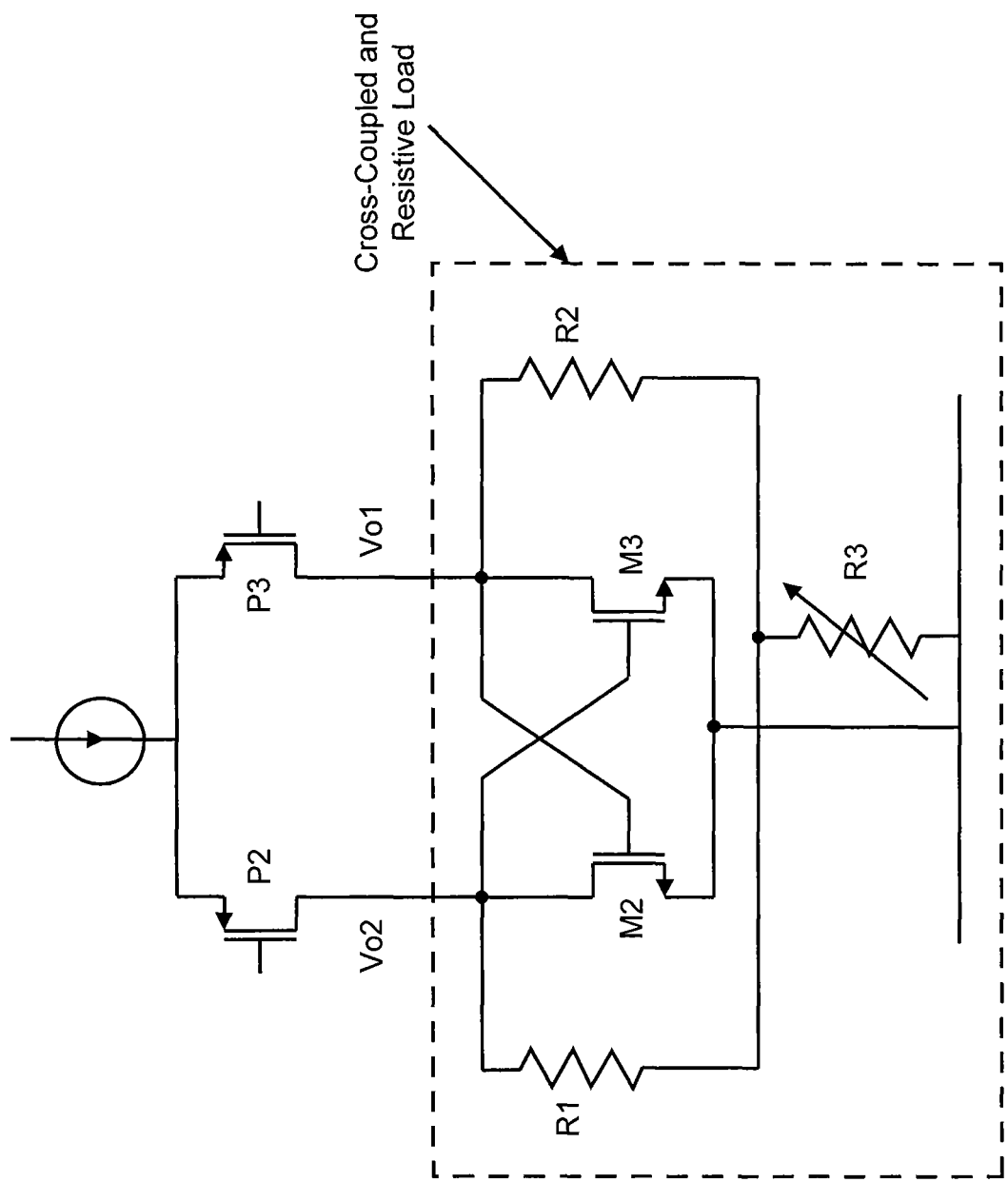
FIG. 7B is a circuit diagram of the cross-coupled resistive load for the one-shot boosting circuit of FIG. 7A.

The cross-coupled resistive load may be formed as shown in FIG. 7B. An NMOS transistor M2 has its source tied to ground and a drain connected to the drain of transistor P2. Similarly, an NMOS transistor M3 has its source tied to ground and a drain connected to the drain of transistor P3. The gate of transistor M2 is cross-coupled to the drain of transistor P3. Similarly, the gate of transistor M3 is cross-coupled to the drain of transistor P2. This cross-coupling increases the switching speed of voltages Vo1 and Vo2. Resistors R1, R2, and a variable resistor R3 complete the cross-coupled resistive load. In a simple resistive load, transistors M2 and M3 would be eliminated.

Figure 8:
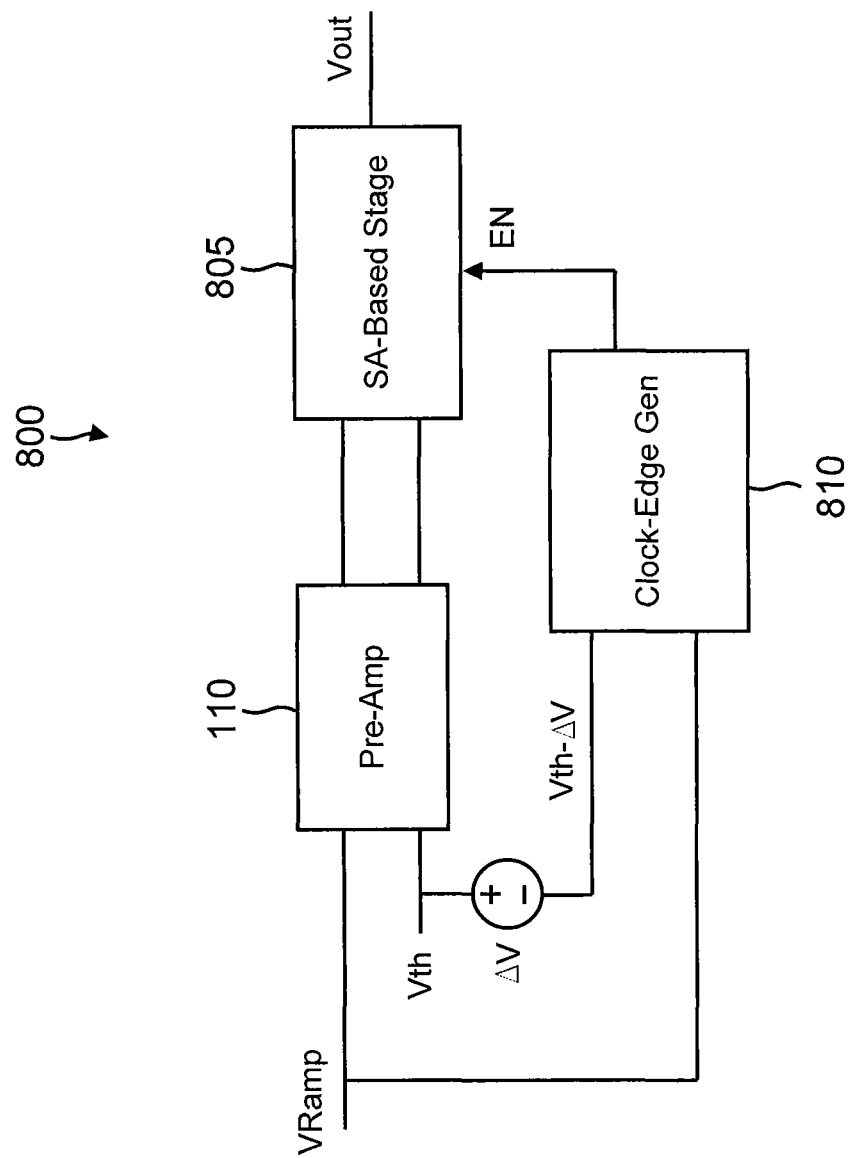
FIG. 8 is a diagram of a pulse width modulator including a boosted sense-amplifier-based comparator in accordance with an aspect of the disclosure.

A pulse width modulator 800 including a clocked comparator 805 (in particular, a sense-amplifier-based comparator) is shown in FIG. 8. A clock edge generator 810 asserts an enable signal EN at the premature trip point. Sense-amplifier-based comparator 805 is enabled by the assertion of the enable signal (which may be an active-high or an active-low assertion) to assert the comparator output signal at the trip point.

Regardless of whether the comparator is a linear comparator or a clocked comparator, the level-shifting may be adjusted based upon the ramp signal period (the switching period for the power switches). As the ramp signal period decreases, the level-shifting may thus be increased accordingly. Conversely, the level-shifting may be decreased as the ramp signal period increases.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A switching power converter pulse width modulator, comprising:
    an error signal generator configured to generate an error signal that is proportional to a difference between an output voltage and a reference voltage;
    a ramp signal generator configured to generate a ramp signal;
    a clock-edge generator configured to assert an enable signal for an enable period responsive to a level-shifted version of the error signal being equal to the ramp signal; and
    a sense-amplifier-based comparator configured to be enabled by the assertion of the enable signal during the enable period, wherein the sense-amplifier-based comparator is further configured to assert a comparator output signal responsive to the ramp signal being equal to the error signal only while the sense-amplifier-based comparator is enabled.

2. The switching power converter pulse width modulator of claim 1, further comprising:
    a power stage configured to respond to the comparator output signal.

3. The switching power converter pulse width modulator of claim 2, wherein the power stage is a buck converter power stage.

4. The switching power converter pulse width modulation of claim 1, further comprising:
    a voltage digital-to-analog-converter configured to generate the reference voltage.

5. A switching power converter pulse width modulator, comprising:
    an error signal generator configured to generate an error signal that is proportional to a difference between an output voltage and a reference voltage;
    a ramp signal generator configured to generate a ramp signal;
    a clock-edge generator configured to assert an enable signal for an enable period responsive to a level-shifted version of the ramp signal being equal to the error signal, wherein the level-shifted version of the ramp signal is greater than the ramp signal by an offset voltage; and
    a sense-amplifier-based comparator configured to be enabled by the assertion of the enable signal during the enable period, wherein the sense-amplifier-based comparator is further configured to assert a comparator output signal responsive to the ramp signal being equal to the error signal only while the sense-amplifier-based comparator is enabled.

6. The switching power converter pulse width modulator of claim 5, further comprising:
    a power stage configured to respond to the comparator output signal.

7. The switching power converter pulse width modulator of claim 6, wherein the power stage is a buck converter power stage.

8. The switching power converter pulse width modulation of claim 5, further comprising:
    a voltage digital-to-analog-converter configured to generate the reference voltage.

* * * * *